United States Patent
Yamasaki et al.

(10) Patent No.: US 6,486,063 B2
(45) Date of Patent: Nov. 26, 2002

(54) SEMICONDUCTOR DEVICE MANUFACTURING METHOD FOR A COPPER CONNECTION

(75) Inventors: Hideaki Yamasaki, Yamanashi (JP); Yumiko Kawano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/793,896

(22) Filed: Feb. 28, 2001

(65) Prior Publication Data

US 2001/0034127 A1 Oct. 25, 2001

(30) Foreign Application Priority Data

Mar. 2, 2000 (JP) ......................... 2000-057125

(51) Int. Cl.$^7$ ............................................. H01L 21/44
(52) U.S. Cl. ....................... 438/687; 438/627; 438/643; 438/678; 438/648; 438/685
(58) Field of Search ................. 438/687, 678, 438/627–628, 643–644, 648, 653–654, 656, 685

(56) References Cited

U.S. PATENT DOCUMENTS

| | | | | |
|---|---|---|---|---|
| 5,677,238 A | * | 10/1997 | Gn et al. | 438/653 |
| 5,710,070 A | * | 1/1998 | Chan | 438/21 |
| 5,981,380 A | * | 11/1999 | Trivedi et al. | 438/639 |
| 5,989,623 A | * | 11/1999 | Chen et al. | 427/97 |
| 6,028,000 A | * | 2/2000 | Cho | 438/638 |
| 6,150,252 A | * | 11/2000 | Hsu et al. | 438/597 |
| 6,260,266 B1 | * | 7/2001 | Tamaki | 438/626 |
| 6,271,592 B1 | * | 8/2001 | Kim et al. | 257/751 |
| 6,284,646 B1 | * | 9/2001 | Leem | 438/629 |
| 6,399,484 B1 | | 6/2002 | Yamasaki et al. | 438/648 |

FOREIGN PATENT DOCUMENTS

JP 2000-200762 7/2000

OTHER PUBLICATIONS

Wei–Yung Hsu et al., "Trench Fill with Low Pressure Long Throw Sputtering and the Microstructure of Damascene–Fabricated Cu Interconnects", Proc. Of Advanced Metallization Conference, pp. 167–168 (1997).

* cited by examiner

Primary Examiner—Tuan H. Nguyen
Assistant Examiner—Thanh Nguyen
(74) Attorney, Agent, or Firm—Finnegan, Henderson, Farabow, Garrett & Dunner, L.L.P.

(57) ABSTRACT

In a semiconductor device manufacturing method, an interlevel insulating film is formed on a silicon substrate. A trench is formed in the interlevel insulating film. A lower underlying film made of a tungsten-based material is formed by thermal chemical vapor deposition to cover a bottom surface and side surface of the trench. An upper underlying film made of a tungsten-based material is formed by thermal chemical vapor deposition on an entire region on the lower underlying film. A copper film made of copper fills the trench. The upper underlying film is formed in accordance with thermal chemical vapor deposition by supplying a tungsten source gas and the other source gas such that the other source gas is supplied in an amount lager than that of the tungsten source gas. The lower underlying film is formed in accordance with thermal chemical vapor deposition by increasing a content of the tungsten source gas to be larger than to that of the other source gas in formation of the lower underlying film.

10 Claims, 7 Drawing Sheets

SEMICONDUCTOR DEVICE MANUFACTURING METHOD FOR A COPPER CONNECTION

BACKGROUND OF THE INVENTION

The present invention relates to a semiconductor device manufacturing method and, more particularly, to a semiconductor device manufacturing method using a tungsten-based material to form an underlying film for a copper interconnection.

In order to realize a high degree of integration and high speed in a semiconductor integrated circuit, various improvements have been proposed. As the interconnection width and interconnection interval are decreased, the interconnection delay adversely affects the circuit performance and the interconnection causes electromigration, leading to a serious decrease in reliability. Some signal delay due to the interconnection is caused by the interconnection resistance.

Some signal delay is caused by the interconnection capacitance among the interconnections integrated at a high density. To decrease the interconnection capacitance that causes signal delay, the interconnection must be micropatterned not only in the lateral direction but also in the direction of thickness. Therefore, when the signal delay caused by the interconnection capacitance is to be suppressed, the current flowing through the interconnection increases, which tends to cause electromigration.

In order to solve this problem, copper with a lower electric resistance has been replacing aluminum to form an interconnection.

When copper is used as the interconnection material, it is diffused in the silicon oxide to adversely affect the transistor element. Also, a copper interconnection has poor adhesion properties with respect to an insulating film.

For this reason, when using copper as the interconnection material, an underlying film is generally used to prevent copper diffusion and to improve the adhesion properties between the interconnection and insulating film (interlevel insulating film).

A conventional interconnection structure forming method using copper will be described in detail with reference to FIGS. 6A to 6D. In this case, a copper interconnection forming method in accordance with the so-called damascene will be described.

Figure 6A:
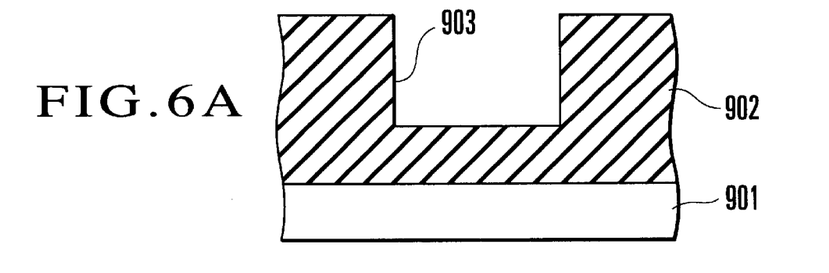
FIGS. 6A to 6D are views showing part of a conventional semiconductor device manufacturing method.

First, as shown in FIG. 6A, an interlevel insulating film 902 is formed on a silicon substrate 901 having elements such as a MOS transistor (not shown), and a trench 903 is formed at its predetermined portion.

Figure 6B:
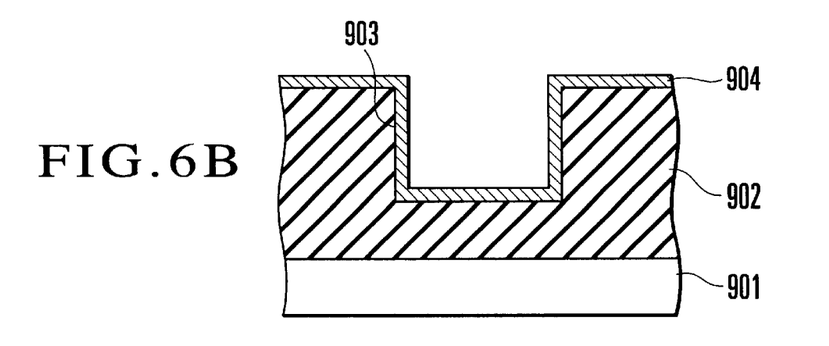

As shown in FIG. 6B, an underlying film 904 for copper diffusion prevention described above and the like is formed on the interlevel insulating film 902 including the bottom and side surfaces of the trench 903.

Figure 6C:
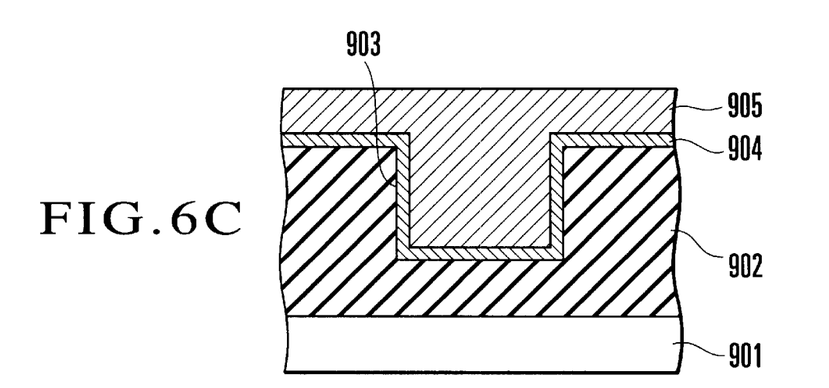

Copper is formed on the underlying film 904 to fill the trench 903 and to form a film that covers the entire surface of the underlying film 904, thereby forming a metal layer 905, as shown in FIG. 6C. This copper film formation is performed by, e.g., plating.

Figure 6D:
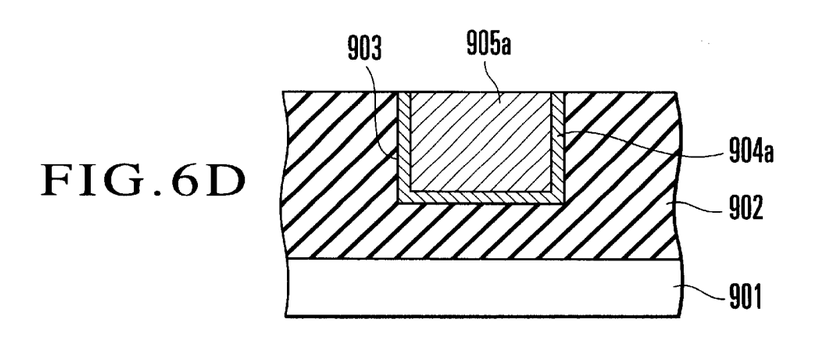

Subsequently, the metal layer 905 on the interlevel insulating film 902, which is above the trench 903, and the underlying film 904 are removed by, e.g., chemical-mechanical polishing to form an underlying film 904a on the side and bottom surfaces of the trench 903, and a copper interconnection 905a is formed through the underlying film 904a, as shown in FIG. 6D.

Tungsten nitride is regarded as a promising material to form the underlying layer for the following reason. An underlying film must be formed on a three-dimensional surface with a trench and the like with a good step coverage. In the above case, the underlying film must be formed with a thickness as uniform as possible not only on the bottom but also on the side surface of the trench. Therefore, a material that can be formed by chemical vapor deposition (CVD) to provide a good step coverage is suitable to form the underlying film. From the above viewpoint, tungsten nitride described above, which can be formed by CVD and have good barrier characteristics to suppress copper diffusion attracts attention as the underlying film material.

Although tungsten nitride has a good step coverage and good copper diffusion suppressing performance (barrier characteristics), as described above, it has poor adhesion properties with respect to an insulating film used as the interlevel insulating film.

SUMMARY OF THE INVENTION

It is, therefore, the principal object of the present invention to provide semiconductor device manufacturing method which, when a copper interconnection material is placed in a trench through an underlying film, improves adhesion properties with respect to an interlevel insulating film while maintaining the good step coverage and barrier characteristics of a tungsten-based material.

In order to achieve the above object, according to the present invention, there is provided a semiconductor device manufacturing method comprising the steps of forming an interlevel insulating film on a semiconductor substrate, forming a trench in the interlevel insulating film, forming a first thin film made of a tungsten-based material by thermal chemical vapor deposition to cover a bottom surface and side surface of the trench, forming a second thin film made of a tungsten-based material by thermal chemical vapor deposition on an entire region on the first thin film, and filling an interconnection material comprised of copper in the trench, wherein the first thin film is formed in accordance with thermal chemical vapor deposition by supplying a tungsten source gas and the other source gas such that the other source gas is supplied in an amount larger than that of the tungsten source gas, and the second thin film is formed in accordance with thermal chemical vapor deposition by increasing a content of the tungsten source gas to be larger than that of the other source gas in formation of the first thin film.

DESCRIPTION OF THE PREFERRED EMBODIMENTS

The present invention will be described by way of its embodiments.

First Embodiment

Figure 1A:
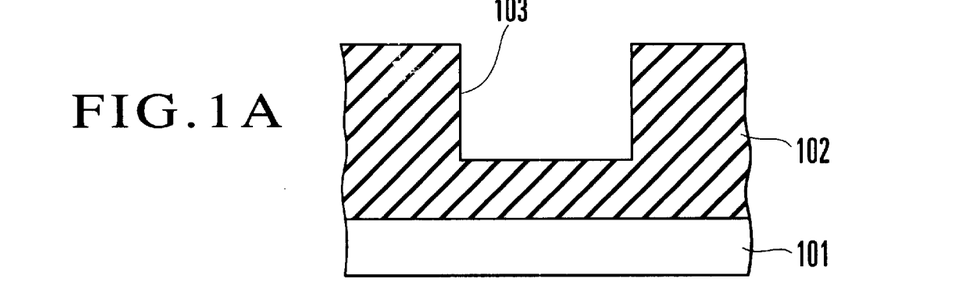
FIGS. 1A to 1E are sectional views showing the steps in a semiconductor device manufacturing method according to an embodiment of the present invention.

FIGS. 1A to 1E show the first embodiment of the present invention. As shown in FIG. 1A, an interlevel insulating film 102 made of silicon oxide is formed on a silicon substrate 101, and a trench 103 is formed in the interlevel insulating film 102. The trench 103 does not reach the silicon substrate 101. Although not shown, elements such a transistor, e.g., a MOSFET, and a diode have already been formed in the other region of the silicon substrate 101 under the interlevel insulating film 102.

Figure 1B:
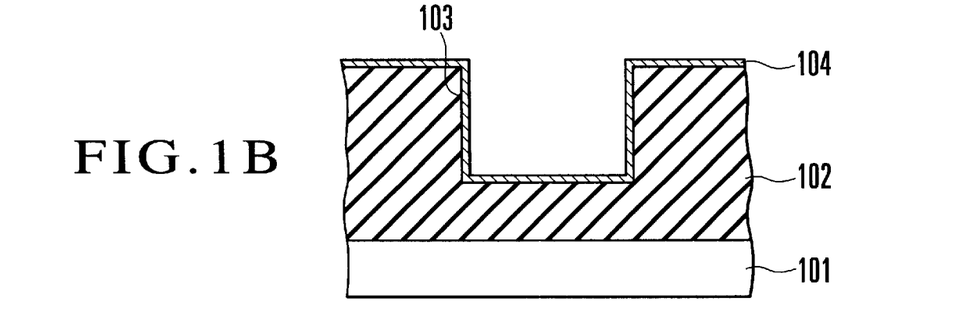

As shown in FIG. 1B, a lower underlying film (first thin film) 104 comprised of a tungsten nitride film is formed on the upper surface of the interlevel insulating film 102, including the side and bottom surfaces of the trench 103, to a thickness of approximately 5 nm. This lower underlying film 104 is formed by thermal CVD (Thermal Chemical Vapor Deposition). Tungsten hexafluoride is used as the tungsten source gas, and ammonia is used as the nitrogen source gas. The supply amount of the ammonia gas (nitrogen source gas) is largely set to be equal to or more than 10 times that of tungsten hexafluoride (tungsten source gas), to form the lower underlying film 104. As a result, the lower underlying film 104 with a good crystallinity is formed to obtain good adhesion properties with respect to the interlevel insulating film 102. When the lower underlying film 104 is formed with the good crystallinity as described above, its step coverage may be decreased more or less. This does not pose a problem in terms of step coverage if the lower underlying film 104 is not formed excessively thick as compared to an upper underlying film with a good step coverage.

Figure 1C:
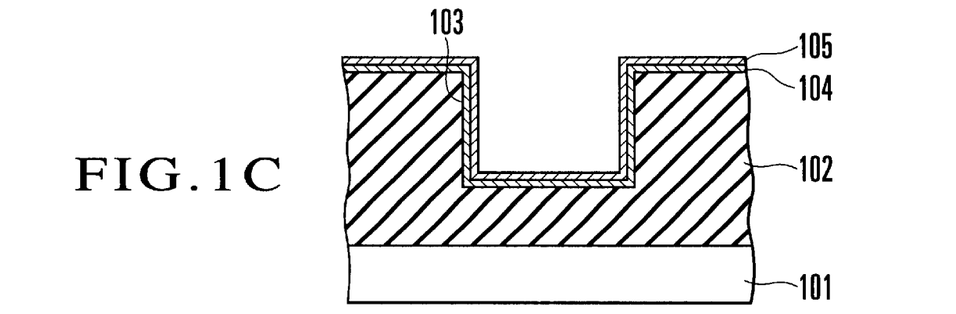

Successively, as shown in FIG. 1C, an upper underlying film (second thin film) 105 made of tungsten nitride is formed on the lower underlying film 104 by thermal CVD to a thickness of approximately 15 nm.

In formation of the upper underlying film 105, the supply amount of the nitrogen source gas is decreased, as compared to that in formation of the lower underlying film 104, to be equal to or less than 4 times that of the tungsten source gas. As a result, the upper underlying film 105 is formed with a good step coverage. When the upper underlying film 105 is formed with the good step coverage, its adhesion properties with respect to the insulating film may be decreased. However, the lower underlying film 104 made of tungsten nitride is present under the upper underlying film 105 such that the adhesion properties between them are good. In this manner, when the upper underlying film 105 is formed through the lower underlying film 104 which has been formed with the good adhesion properties, even if the upper underlying film 105 is formed to have a better step coverage, a problem such as peeling of the upper underlying film 105 does not occur.

Figure 1D:
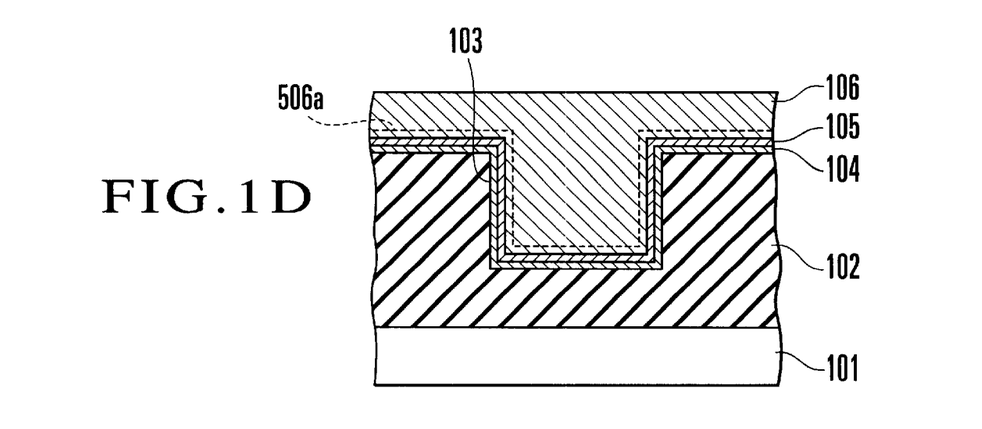

Subsequently, as shown in FIG. 1D, a copper film 106 is formed on the upper underlying film 105 by electroplating so as to fill the trench 103. More specifically, copper fills the trench 103, to further form the copper film 106, as shown in FIG. 1D, which is placed above the trench 103. Prior to formation of the copper film 106 by electroplating, a seed layer (506a; indicated by a wavy line) is formed on the upper surface of the upper underlying film 105 in advance.

Figure 1E:
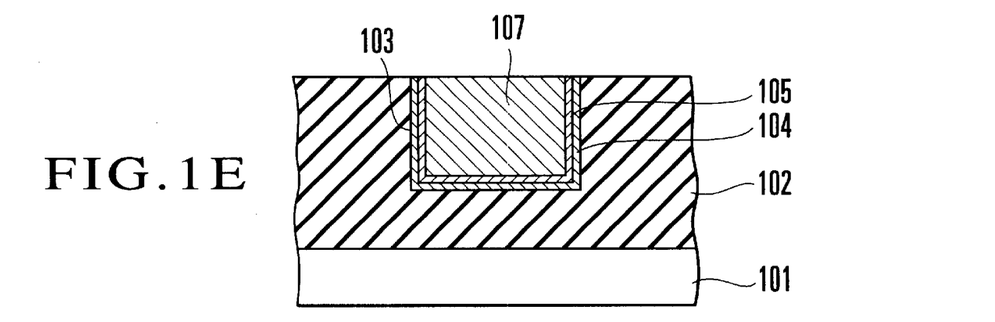

Finally, as shown in FIG. 1E, part of the copper film 106 and upper and lower underlying films 105 and 104, which are above the interlevel insulating film 102, are removed by, e.g., chemical-mechanical polishing (CMP), to expose the interlevel insulating film 102. A copper interconnection 107 is formed in the trench 103, together with the lower and upper underlying films 104 and 105 on the side and bottom surfaces of the trench 103, through these underlying films 104 and 105.

Second Embodiment

The second embodiment of the present invention will be described.

Figure 2A:
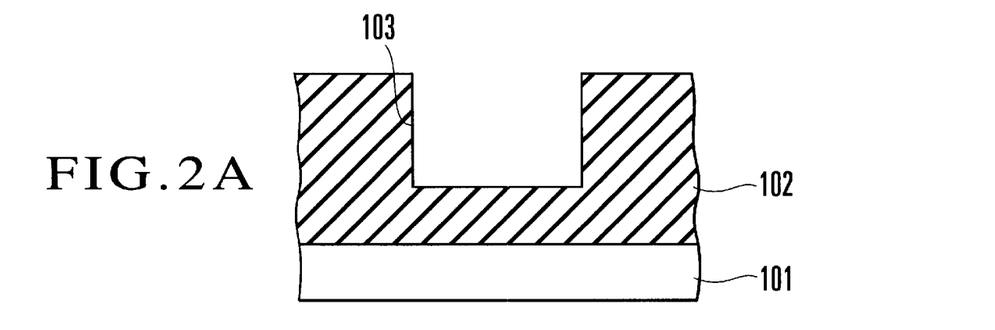
FIGS. 2A to 2E are sectional views showing the steps in a method according to another embodiment of the present invention.
Figure 2B:
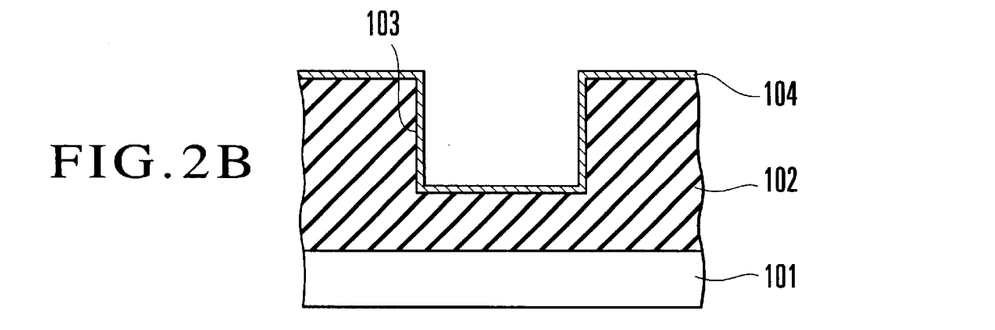

As shown in FIG. 2A, a trench 103 is formed in a silicon oxide interlevel insulating film 102 formed on a silicon substrate 101. As shown in FIG. 2B, a lower underlying film 104 comprised of a tungsten nitride film is formed on the interlevel insulating film 102, including the interior of the trench 103, by thermal CVD. In formation of the lower underlying film 104, tungsten hexafluoride is used as the tungsten source gas, and ammonia is used as the nitrogen source gas. At this time, the supply amount of the ammonia gas is largely set to be equal to or more than 10 times that of tungsten hexafluoride, to form the lower underlying film 104. As a result, the lower underlying film 104 with a good crystallinity is formed to obtain good adhesion properties with respect to the interlevel insulating film 102. Note that a good step coverage cannot be obtained.

Figure 2C:
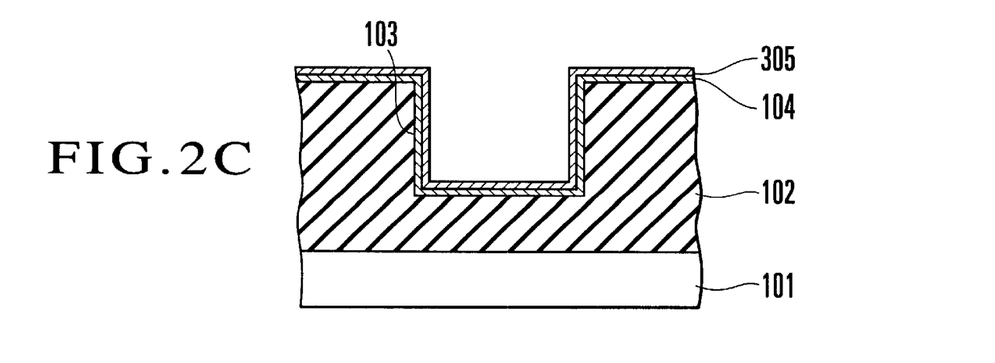
Figure 2D:
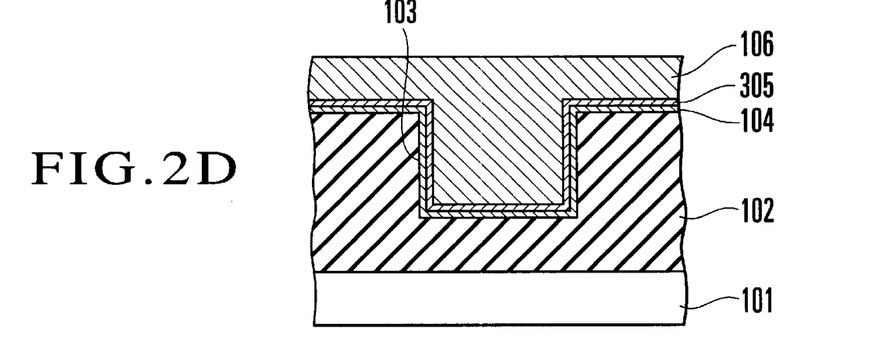

Successively, as shown in FIG. 2C, an upper underlying film 305 made of tungsten is formed on the lower underlying film 104 by thermal CVD. After that, as shown in FIG. 2D, a copper film 106 is formed on the upper underlying film 305 by electroplating so that copper fills the trench 103. In the second embodiment, since the upper surface of the upper underlying film 305 made of tungsten with a high conductivity is electroplated with copper, the copper film 106 can be formed without forming a seed layer on the upper underlying film 305, unlike in the first embodiment.

Figure 2E:
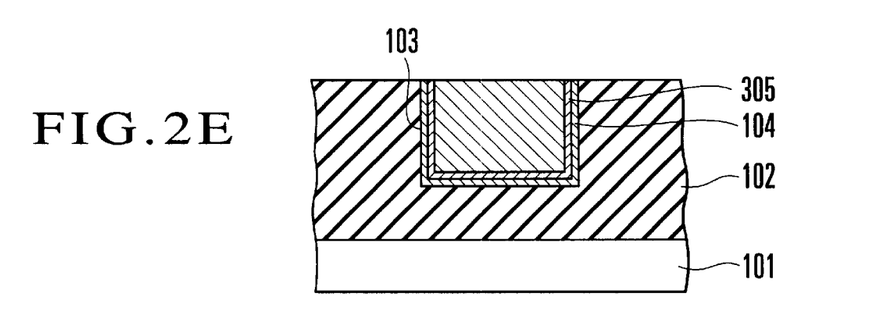

As shown in FIG. 2E, the copper film 106 and upper and lower underlying films 305 and 104, which are above the interlevel insulating film 102, are partially removed by, e.g., chemical-mechanical polishing. A copper interconnection 107 is formed in the trench 103, together with the lower and upper underlying films 104 and 305 on the side and bottom surfaces of the trench 103, through these underlying films 104 and 305.

As described above, according to the second embodiment, the underlying film is comprised of the lower underlying film made of tungsten nitride and the upper underlying film substantially made of tungsten. Consequently, as the upper underlying film has a low electric resistance, when its upper surface is to be electroplated with copper, a seed layer need not be formed in advance.

The upper underlying film may be formed in the following manner, such that it is partially made of tungsten nitride. In formation of the upper underlying film, first, the content of the tungsten source gas is gradually increased during film formation time, such that the closer to the uppermost surface, the larger the content of tungsten. Thus, the uppermost surface of the upper underlying film is formed of only tungsten. The upper underlying film formed in this manner can also be electroplated with copper without forming a seed layer.

Third Embodiment

The third embodiment of the present invention will be described.

Figure 3A:
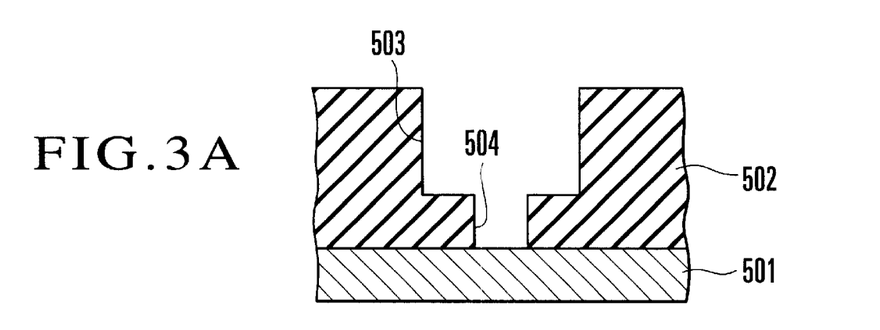
FIGS. 3A to 3E are sectional views showing the steps in a method according to still another embodiment of the present invention.

As shown in FIG. 3A, an interlevel insulating film 502 made of silicon oxide is formed on a copper lower interconnection layer 501, and a trench 503 and through hole 504 are formed in the interlevel insulating film 502. The through hole 504 reaches a region on the lower interconnection layer 501 where the trench 503 extends.

Figure 3B:
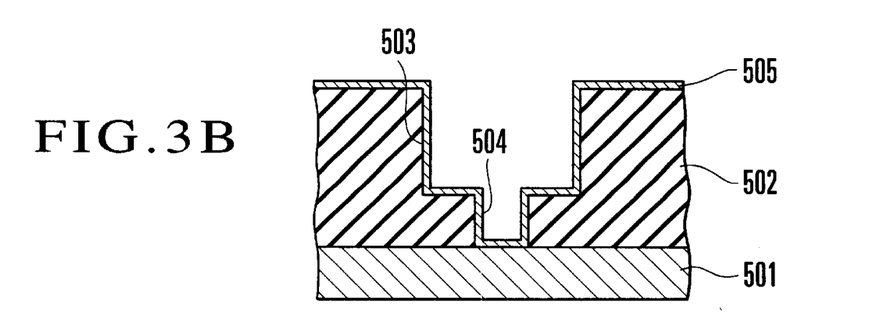

As shown in FIG. 3B, a lower underlying film 505 comprised of a tungsten nitride film is formed on the interlevel insulating film 502 including the interiors of the through hole 504 and trench 503. The tungsten nitride film is formed by thermal CVD. Tungsten hexafluoride is used as the tungsten source gas, and ammonia is used as the nitrogen source gas. The supply amount of ammonia gas (nitrogen source gas) is largely set to be equal to or more than 10 times that of tungsten hexafluoride (tungsten source gas). Thus, the lower underlying film 505 is formed with a good crystallinity to obtain good adhesion properties with respect to the interlevel insulating film 502. Note that a good step coverage cannot be obtained. In the through hole 504 with a smaller opening region than that of the trench 503, the supply amount of the source gas decreases. Therefore, the lower underlying film 505 is formed thin particularly at the bottom of the through hole 504.

Figure 3C:
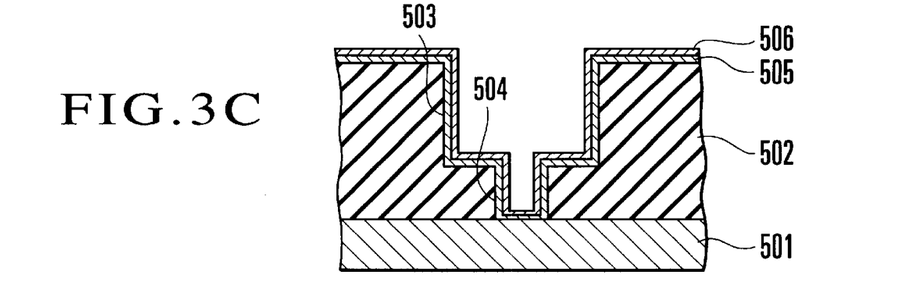

Successively, as shown in FIG. 3C, an upper underlying film 506 is formed on the lower underlying film 505.

In formation of the upper underlying film 506, the supply amount of the nitrogen source gas is decreased, as compared to that in formation of the lower underlying film 505, to be equal to or less than 4 times that of the tungsten source gas. As a result, the upper underlying film 506 is formed with a good step coverage. When the upper underlying film 506 is formed with the good step coverage, its adhesion properties with respect to the insulating film may be decreased. However, the lower underlying film 505 made of tungsten nitride is present under the upper underlying film 506, such that the adhesion properties between them are good. In this manner, when the upper underlying film 506 is formed through the lower underlying film 505 which has been formed with the good adhesion properties, even if the upper underlying film 506 is formed to have a better step coverage, a problem such as peeling of the upper underlying film 506 does not occur. Regarding formation of the upper underlying film 506, in the through hole 504 with a smaller opening area than that of the trench 503, the supply amount of the source gas decreases. Therefore, the upper underlying film 506 is formed thin particularly at the bottom of the through hole 504.

Figure 3D:
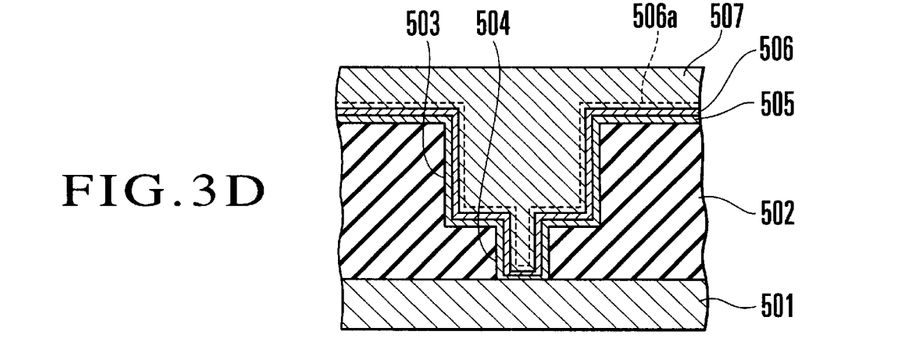

Subsequently, as shown in FIG. 3D, a copper film 507 is formed on the upper underlying film 506 by electroplating so as to fill the trench 503 and through hole 504. Prior to formation of the copper film 507 by electroplating, a seed layer (506a; indicated by a wavy line) is formed on the upper surface of the upper underlying film 506 in advance.

Figure 3E:
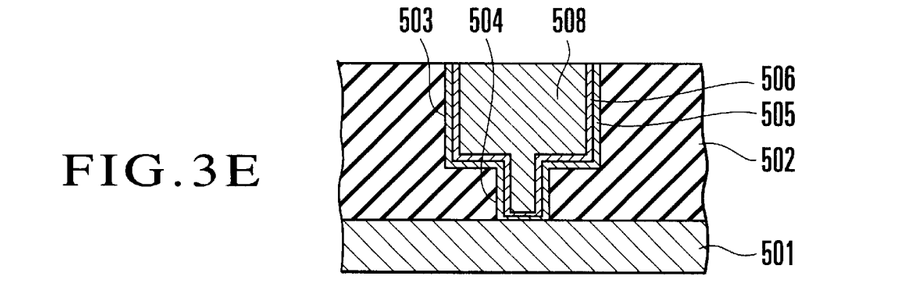

Finally, as shown in FIG. 3E, the copper film 507 and upper and lower underlying films 506 and 505, which are above the interlevel insulating film 502, are partially removed by, e.g., chemical-mechanical polishing (CMP). A copper interconnection 508 is formed in the trench 503 through the underlying film. The interconnection 508 is connected to the lower interconnection layer 501 through a plug made of copper that fills the through hole 504.

As described above, according to the third embodiment, the interconnection 508 is formed in the trench 503 through the underlying layer. The plug which connects the interconnection 508 and lower interconnection layer 501 is also formed in the through hole 504 through the underlying film. In the through hole 504, the plug is connected to the lower interconnection layer 501 through the upper and lower underlying films 506 and 505. As described above, since the respective underlying films at the bottom of the through hole 504 are thin, even if the underlying films are made of tungsten nitride, the resistance between the lower interconnection layer 501 and interconnection 508 does not increase.

Fourth Embodiment

The fourth embodiment of the present invention will be described.

Figure 4A:
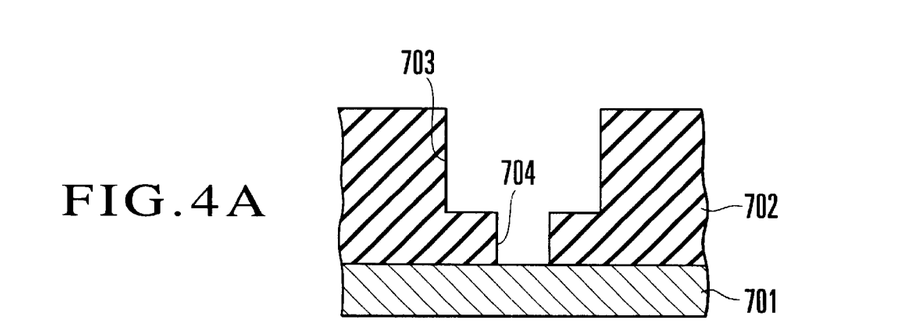
FIGS. 4A to 4E are sectional views showing the steps in a method according to still another embodiment of the present invention.

As shown in FIG. 4A, an interlevel insulating film 702 made of silicon oxide is formed on a copper lower interconnection layer 701, and a trench 703 and through hole 704 are formed in the interlevel insulating film 702. The through hole 704 reaches a region on the lower interconnection layer 701 where the trench 703 extends.

Figure 4B:
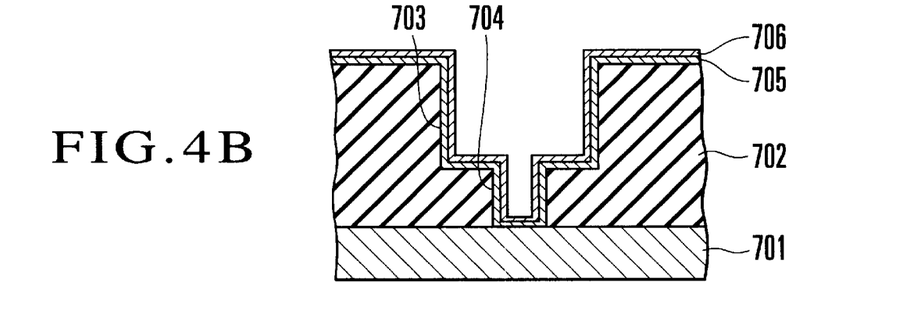

As shown in FIG. 4B, a lower underlying film 705 comprised of a tungsten nitride film is formed on the interlevel insulating film 702 including the interiors of the through hole 704 and trench 703. The tungsten nitride film is formed by thermal CVD. Tungsten hexafluoride is used as the tungsten source gas, and ammonia is used as the nitrogen source gas. The supply amount of ammonia gas is largely set to be equal to or more than 10 times that of tungsten hexafluoride. Thus, the lower underlying film 705 is formed with a good crystallinity to obtain good adhesion properties with respect to the interlevel insulating film 702. Note that a good step coverage cannot be obtained. In the through hole 704 with a smaller opening region than that of the trench 703, the supply amount of the source gas decreases. Therefore, the lower underlying film 705 is formed thin particularly at the bottom of the through hole 704.

Figure 4C:
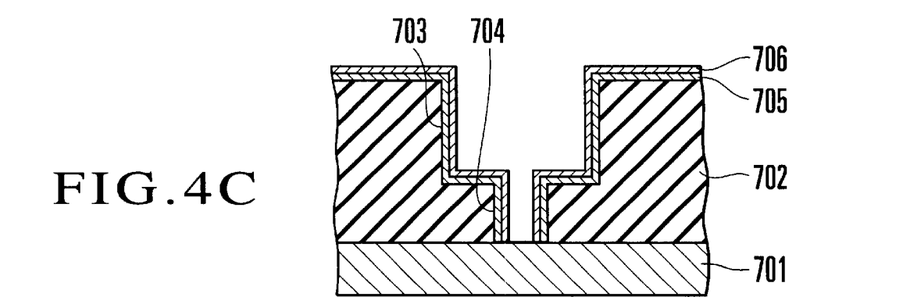

Successively, an upper underlying film 706 is formed on the lower underlying film 705.

In formation of the upper underlying film 706, the supply amount of the nitrogen source gas is decreased, as compared to that in formation of the lower underlying film 705, to be equal to or less than 4 times that of the tungsten source gas. As a result, the upper underlying film 706 is formed with a good step coverage. Regarding formation of the upper underlying film 706, in the through hole 704 with the smaller opening region than that of the trench 703, the supply amount of the source gas decreases. Therefore, the upper underlying film 706 is formed thin particularly at the bottom of the through hole 704.

Copper is deposited on the upper underlying film 706 by electroplating, in the same manner as in the above embodiments. In the fourth embodiment, copper is deposited while dissolving tungsten nitride. When copper is deposited while dissolving tungsten nitride, the thin upper and lower underlying films 706 and 705 at the bottom of the lower underlying film 705 dissolve to expose the surface of the underlying lower interconnection layer 701 to the bottom of the through hole 704. At the bottom and side surfaces of the trench 703 and the side surface of the through hole 704, the underlying films are thick as compared to at the bottom of the through hole 704. Thus, the upper underlying film 706 at these regions does not disappear.

Figure 4D:
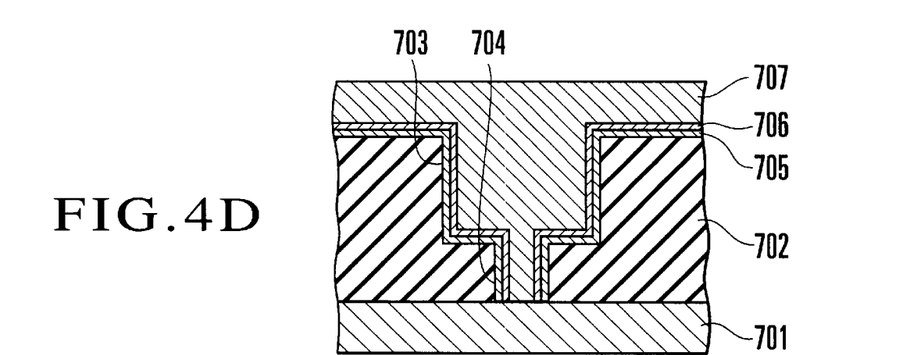

After that, copper starts to deposit to fill the trench 703 and through hole 704. As a result, a copper film 707 is formed, as shown in FIG. 4D.

Figure 4E:
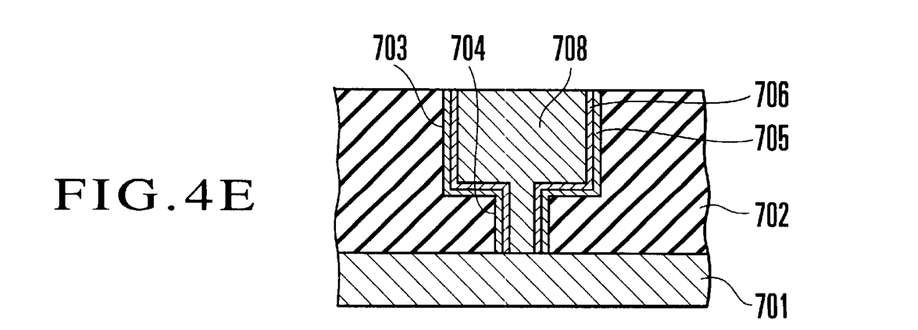

Finally, as shown in FIG. 4E, the copper film 707 and upper and lower underlying films 706 and 705, which are above the interlevel insulating film 702, are partially removed by, e.g., chemical-mechanical polishing (CMP). A copper interconnection 708 is formed in the trench 703 through the underlying film. The interconnection 708 is connected to the lower interconnection layer 701 through a plug made of copper that fills the through hole 704.

As described above, according to the fourth embodiment, the interconnection 708 is formed in the trench 703 through the underlying layer. The plug which connects the interconnection 708 and lower interconnection layer 701 is also formed in the through hole 704 through the underlying film. According to the fourth embodiment, the plug that fills the through hole 704 is formed such that copper at its lower surface comes into direct contact with the lower interconnection layer 701. Thus, the interconnection 708 and lower interconnection layer 701 are connected to each other with a very low resistance.

As the technique characterized and commonly used among the embodiments described above, the first thin film was formed in accordance with thermal chemical vapor deposition by supplying the tungsten-based source gas and the other source gas such that the content of the other source gas is larger than that of the tungsten-based material source gas, and the second thin film was formed in accordance with thermal chemical vapor deposition by increasing the content of the tungsten-based material source gas to be larger than that in formation of the first thin film.

Regarding this, the step coverage characteristics were studied by using $WF_6$ as the tungsten-based source gas and ammonia ($NH_3$) as the other source gas. The characteristics as shown in FIG. 5 were obtained.

Figure 5:
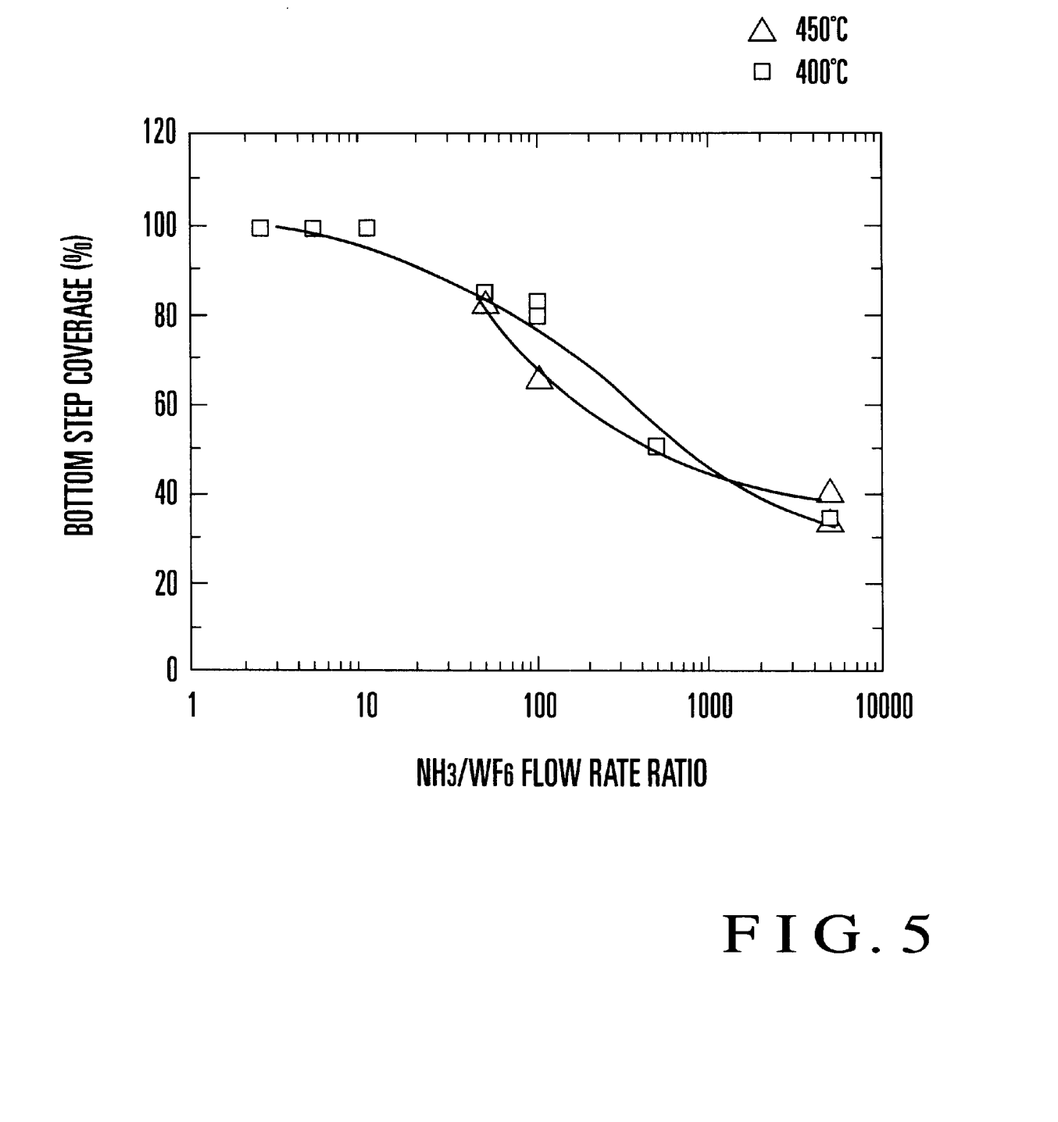
FIG. 5 is a graph showing the step coverage characteristics when $WF_6$ is used as the tungsten-based source gas and $NH_3$ is used as the other source gas.

FIG. 5 shows the step coverage characteristics. When the flow rate ratio $WF_6/NH_3$ of $WF_6$ to $NH_3$ is large (when the left column is larger), a good step coverage can be obtained. Therefore, in the present invention, this technique was used for forming the second film.

The following table shows the adhesion properties of the first thin film with respect to the interlevel insulating film. The flow rate ratio $WF_6/NH_3$ of $WF_6$ to $NH_3$ is small.

| Sample | Flow Rate Ratio of $WF_6$ to $NH_3$ ($WF_6/NH_3$) | Adhesion Properties | |
|---|---|---|---|
| | | As Deposition | After 650° C. Anneal |
| A | 0.002 | ○ | ○ |
| B | 0.04 | ○ | Δ |
| C | 2 | ○ | x |

(Note) ○: very good; Δ: good; and x: poor

With the samples A and B, the adhesion properties are good. With the sample C, although the as-deposition adhesion properties are good, after annealing, the adhesion properties become poor.

As has been described above, according to the present invention, a semiconductor device manufacturing method comprises the steps of forming an interlevel insulating film on a semiconductor substrate, forming a trench in the interlevel insulating film, forming a first thin film made of a tungsten-based material to cover a bottom surface and side surface of the trench, forming a second thin film made of a tungsten-based material on an entire region on the first thin film, and forming an interconnection made of copper in the trench by forming copper through the first and second thin films. The first thin film is formed in accordance with thermal chemical vapor deposition by supplying a source gas of the tungsten-based material and the other source gas such that the other source gas is supplied in an amount larger than that of the source gas of the tungsten-based material. The second thin film is formed in accordance with thermal chemical vapor deposition by increasing the content of the tungsten source gas to be larger than that in formation of the first thin film.

Then, the first thin film is formed with a good crystallinity, while the second thin film is formed with a good step coverage. A tungsten-based material with a good crystallinity is formed to have good adhesion properties also with respect to an interlevel insulating film made of an insulator. As a result, a good effect can be obtained in that the adhesion properties of the underlying film made of the tungsten-based material, which is used to form the copper interconnection structure, are improved.

What is claimed is:

1. A semiconductor device manufacturing method comprising the steps of:

forming and interlevel insulating film on a semiconductor substrate;

forming a trench in the interlevel insulating film;

forming a first thin film made of a tungsten-based material by thermal chemical vapor deposition to cover a bottom surface and side surface of the trench;

forming a second thin film made of the tungsten-based material by thermal chemical vapor deposition on an entire region on the first thin film; and filling an interconnection material comprised of copper in the trench, wherein the first thin film is formed in accordance with thermal chemical vapor deposition by supplying a tungsten source gas and a second source gas such that the second source gas is supplied in an amount larger than that of the tungsten source gas, and the second thin film is formed in accordance with thermal chemical vapor deposition by increasing a content of the tungsten source gas to be larger than that of the second source gas in formation of the first thin film.

2. A method according to claim 1, wherein the tungsten-based materials used to form the first and second thin films are tungsten nitride.

3. A method according to claim 1, wherein the method further comprises the step of forming a lower interconnection layer under the interlevel insulating film in advance, the step of forming the trench in the interlevel insulating film includes the step of forming a through hole in a bottom of the trench to reach the lower interconnection layer, the steps of forming the first and second thin films include the steps of forming the first and second thin films also on a side surface and bottom surface of the through hole; and the step of charging the copper interconnection material in the trench includes the step of filling the copper interconnection material also in the through hole in the same manner as in the trench.

4. A method according to claim 3, wherein the step of filling the copper interconnection material in the trench and the through hole is performed by electroplating.

5. A method according to claim 4, wherein a seed layer is formed on a surface of the second thin film before the copper interconnection material fills the trench and the through hole by electroplating.

6. A method according to claim 4, wherein the step of filling the copper interconnection material in the trench and the through hole is performed by electroplating under such a condition that the tungsten-based material is dissolved.

7. A method according to claim 1, wherein the step of filling the copper interconnection material in the trench is performed by electroplating.

8. A method according to claim 7, wherein a seed layer is formed on a surface of the second thin film before the copper interconnection material fills the trench by electroplating.

9. A method according to claim 7, wherein the step of filling the copper interconnection material in the trench is performed by electroplating under such a condition that the tungsten-based material is dissolved.

10. A semiconductor device manufacturing method comprising the steps of:

forming an interval insulating film on a semiconductor substrate;

forming a trench in the interlevel insulating film;

forming a first thin film made of a tungsten-based material by thermal chemical vapor deposition to cover a bottom surface and side surface of the trench;

forming a second thin film made of the tungsten-based material by thermal chemical vapor deposition on an entire region on the first thin film; and filling an interconnection material comprised of copper in the trench, wherein the first thin film is formed in accordance with thermal chemical vapor deposition by supplying a tungsten source gas; and the second thin film is formed in accordance with thermal chemical vapor deposition by changing the content of the tungsten source gas in formation of the first thin film.

* * * * *